(12) United States Patent
Ishihara et al.

(10) Patent No.: US 10,044,330 B2
(45) Date of Patent: Aug. 7, 2018

(54) POWER AMPLIFIER MODULE

(71) Applicant: Murata Manufacturing Co., Ltd., Kyoto (JP)

(72) Inventors: Shota Ishihara, Kyoto (JP); Seiko Ono, Kyoto (JP); Yusuke Shimamune, Kyoto (JP); Fuminori Morisawa, Kyoto (JP); Shizuki Nakajima, Kyoto (JP); Yuri Honda, Kyoto (JP); Kazuhiro Koshio, Kyoto (JP); Masato Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/710,426

(22) Filed: Sep. 20, 2017

(65) Prior Publication Data

US 2018/0083581 A1    Mar. 22, 2018

(30) Foreign Application Priority Data

Sep. 21, 2016   (JP) ................................. 2016-184752

(51) Int. Cl.
*H03F 3/21*   (2006.01)
(52) U.S. Cl.
CPC ...................... *H03F 3/21* (2013.01)
(58) Field of Classification Search
CPC ........................................................ H03F 3/21
See application file for complete search history.

(56) References Cited

U.S. PATENT DOCUMENTS

| | | | |
|---|---|---|---|
| 7,132,891 B1 | 11/2006 | Dening et al. | |
| 7,605,651 B2 | 10/2009 | Ripley et al. | |
| 7,956,682 B2* | 6/2011 | Hasegawa | H03F 1/223 330/311 |
| 9,106,185 B2* | 8/2015 | Youssef | H03F 1/08 |
| 9,559,654 B2 | 1/2017 | Nakamura et al. | |
| 2009/0085664 A1* | 4/2009 | Yang | H03F 1/0261 330/277 |
| 2009/0096531 A1 | 4/2009 | Shimamoto et al. | |
| 2010/0237945 A1 | 9/2010 | Cassia et al. | |

(Continued)

FOREIGN PATENT DOCUMENTS

| | | |
|---|---|---|
| CN | 105009447 A | 10/2015 |
| JP | 2009-100197 A | 5/2009 |

(Continued)

*Primary Examiner* — Patricia T Nguyen
(74) *Attorney, Agent, or Firm* — Pearne & Gordon LLP

(57) ABSTRACT

A power amplifier module includes a first current source that outputs a first current corresponding to a level control voltage for controlling a signal level of an amplified signal, a second current source that outputs a second current corresponding to the level control voltage, a first transistor in which an input signal and a first bias current are supplied to a base and an emitter is grounded, a second transistor in which an emitter is connected to a collector of the first transistor, the second current is supplied to a base, and a first amplified signal obtained by amplifying the input signal is output from a collector, and a third transistor in which the first current is supplied to a collector, a bias control current or voltage is supplied to a base, and the first bias current is supplied from an emitter to the base of the first transistor.

23 Claims, 11 Drawing Sheets

(56) References Cited

U.S. PATENT DOCUMENTS

| | | | |
|---|---|---|---|
| 2010/0301944 A1* | 12/2010 | Yamamoto | H01L 27/0605 |
| | | | 330/277 |
| 2014/0253242 A1 | 9/2014 | Youssef et al. | |
| 2014/0340149 A1* | 11/2014 | Johnson | H03F 1/14 |
| | | | 330/257 |
| 2014/0368277 A1 | 12/2014 | Ding et al. | |
| 2016/0241202 A1 | 8/2016 | Lehtola et al. | |
| 2017/0359038 A1* | 12/2017 | Tanaka | H03F 1/0205 |

FOREIGN PATENT DOCUMENTS

| | | |
|---|---|---|
| JP | 2014-068358 A | 4/2014 |
| TW | I508432 B | 11/2015 |

* cited by examiner

POWER AMPLIFIER MODULE

This application claims priority from Japanese Patent Application No. 2016-184752 filed on Sep. 21, 2016. The content of this application is incorporated herein by reference in its entirety.

BACKGROUND

The present disclosure relates to a power amplifier module.

A mobile communication device such as a cellular phone includes a power amplifier module that is used to amplify the power of a radio frequency (RF) signal to be transmitted to a base station. For example, in GSM (registered trademark) (Global System for Mobile Communications), the gain of a power amplifier module is controlled to implement slope control (ramp-up and ramp-down) of a transmission signal from a mobile communication device to a base station.

Japanese Unexamined Patent Application Publication No. 2009-100197 discloses a configuration for supplying a voltage $V_{LDO}$ output from a low dropout (LDO) regulator to a collector terminal of each of three-stage amplifiers in a power amplifier module. In the disclosed configuration, the level of the voltage $V_{LDO}$ is adjusted on the basis of a level control voltage Vramp to control the gain of the power amplifier module.

U.S. Pat. No. 7,605,651 discloses a configuration of a power amplifier module that includes three-stage amplifiers, in which a voltage $V_{REG}$ output from an LDO regulator is supplied to the first- and second-stage amplifiers and a constant power supply voltage is supplied to the three-stage amplifier.

As described above, in the configurations disclosed in Japanese Unexamined Patent Application Publication No. 2009-100197 and U.S. Pat. No. 7,605,651, an LDO regulator is used to control the gain of a power amplifier module. In general, an LDO regulator leads to a large circuit size because of large current flow.

BRIEF SUMMARY

Accordingly, the present disclosure provides a power amplifier module for performing slope control of a transmission signal, in which an increase in circuit size is prevented or reduced.

According to embodiments of the present disclosure, a power amplifier module includes a first current source that outputs a first current corresponding to a level control voltage for controlling a signal level of an amplified signal, a second current source that outputs a second current corresponding to the level control voltage, a first transistor having a collector, a base, and an emitter, wherein an input signal and a first bias current are supplied to the base and the emitter is grounded, a second transistor having a collector, a base, and an emitter, wherein the emitter is connected to the collector of the first transistor, the second current is supplied to the base, and a first amplified signal obtained by amplifying the input signal is output from the collector, and a third transistor having a collector, a base, and an emitter, wherein the first current is supplied to the collector, a bias control current or voltage is supplied to the base, and the first bias current is supplied from the emitter to the base of the first transistor.

According to embodiments of the present disclosure, in a power amplifier module for performing slope control of a transmission signal, it may be possible to prevent or reduce an increase in circuit size and it may also be possible to satisfy desired characteristics.

Other features, elements, characteristics and advantages of the present disclosure will become more apparent from the following detailed description of embodiments of the present disclosure with reference to the attached drawings.

DETAILED DESCRIPTION

Figure 1:
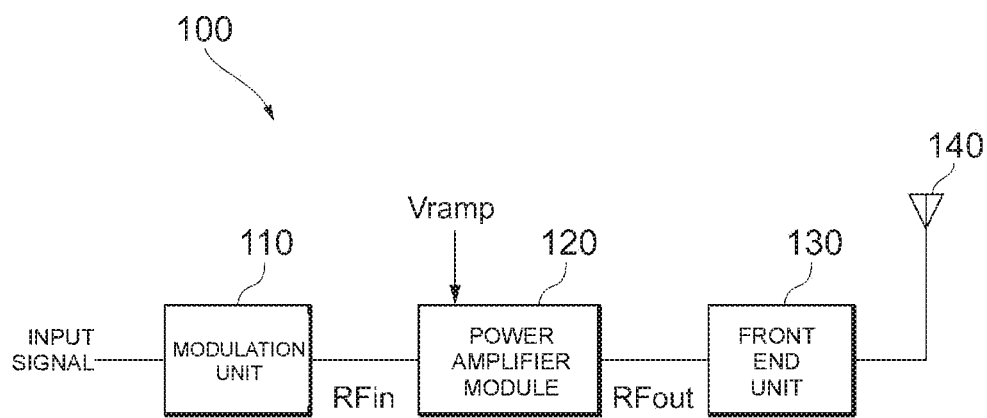
FIG. 1 is a diagram illustrating an example configuration of a transmitting unit that includes a power amplifier module according to an embodiment of the present disclosure.

An embodiment of the present disclosure will be described hereinafter with reference to the drawings. FIG. 1 is a diagram illustrating an example configuration of a transmitting unit that includes a power amplifier module according to an embodiment of the present disclosure. A transmitting unit 100 is included in a mobile communication device such as a cellular phone, for example, and is used to transmit various signals such as audio and data signals to a base station. The mobile communication device also includes a receiving unit to receive a signal from the base station, which is not described herein.

As illustrated in FIG. 1, the transmitting unit 100 includes a modulation unit 110, a power amplifier module 120, a front end unit 130, and an antenna 140.

The modulation unit 110 modulates an input signal in accordance with the GSM (registered trademark) or Enhanced Data Rates for GSM Evolution (EDGE) modulation scheme and generates a radio frequency (RF) signal for wireless transmission. The RF signal lies in a range of about several hundreds of megahertz (MHz) to about several gigahertz (GHz), for example.

The power amplifier module 120 amplifies the power of an input signal RFin to a level necessary for transmission to a base station and outputs an amplified signal RFout. Further, the power amplifier module 120 performs slope control of the amplified signal by controlling the gain on the basis of a voltage Vramp (level control voltage) for controlling a signal level.

Figure 2:
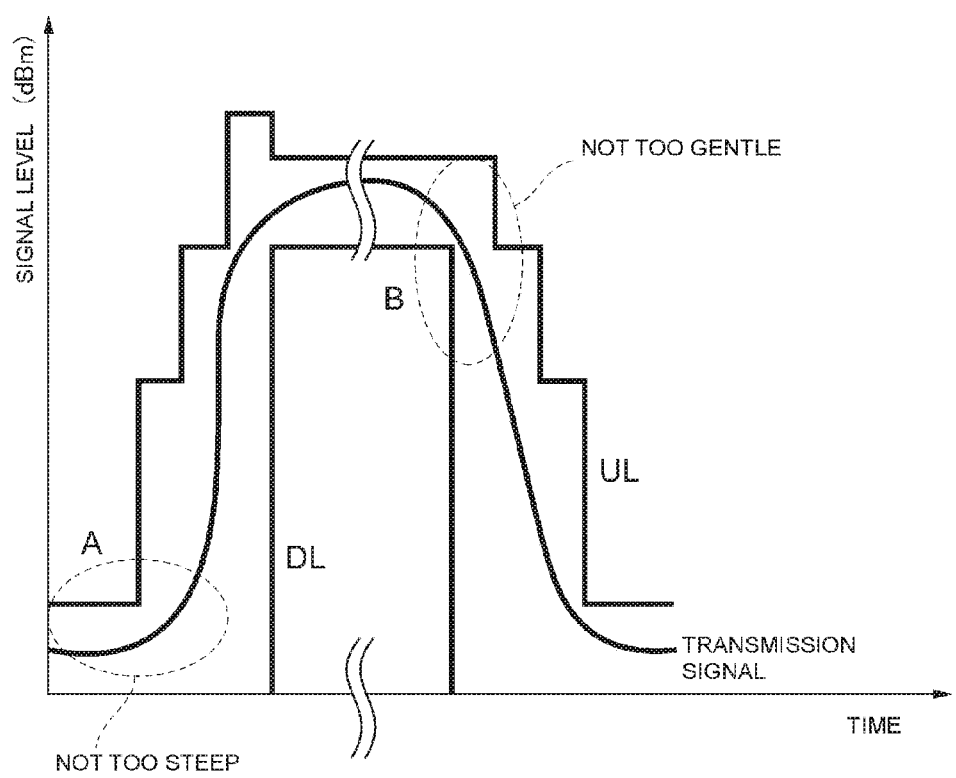
FIG. 2 is a diagram illustrating an example of slope control of a transmission signal.

FIG. 2 is a diagram illustrating an example of the slope control of a transmission signal. In the slope control, as illustrated in FIG. 2, it is necessary to control the signal level of a transmission signal so that the signal level falls within a range between a lower limit DL and an upper limit UL. In a portion (an area including a rising edge) represented by A in FIG. 2, the signal level of the transmission signal needs to be controlled so that a predetermined rate of change (slope) is maintained in such a manner that the signal level does not exceed the upper limit UL or fall below the lower limit DL. In a portion (an area including a falling edge) represented by B in FIG. 2, the signal level of the transmission signal needs to be controlled so that a predetermined rate of change is maintained in such a manner that the signal level does not exceed the upper limit UL or fall below the lower limit DL.

Figure 3:
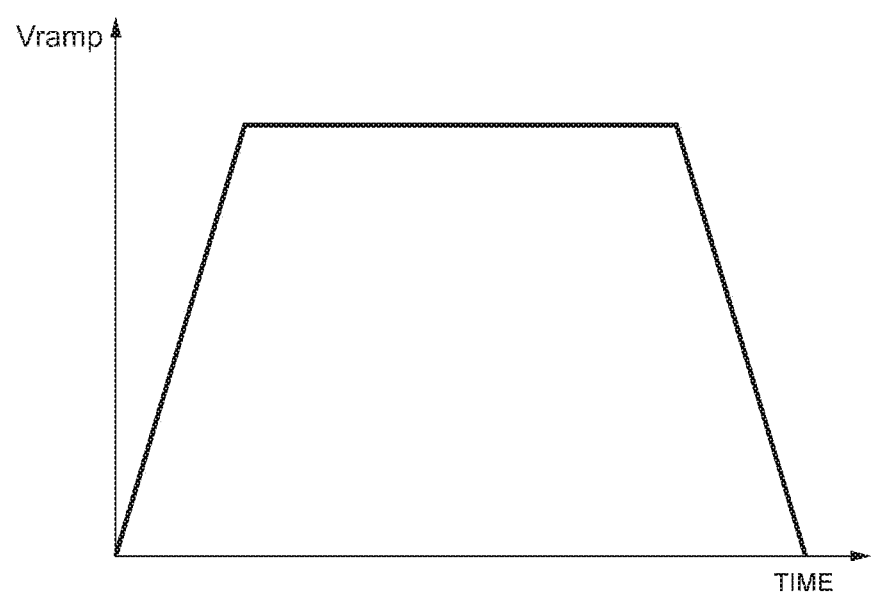
FIG. 3 is a diagram illustrating an example of a voltage (level control voltage) input to the power amplifier module.

FIG. 3 is a diagram illustrating an example of the voltage Vramp input to the power amplifier module 120. In the power amplifier module 120, the gain is controlled on the basis of the voltage Vramp, which changes in the manner illustrated in FIG. 3, to control the signal level of the transmission signal in the manner illustrated in FIG. 2.

Referring back to FIG. 1, the front end unit 130 performs operations such as filtering the amplified signal RFout and switching between the amplified signal RFout and a reception signal that is received from the base station. The amplified signal output from the front end unit 130 is transmitted to the base station via the antenna 140.

Figure 4:
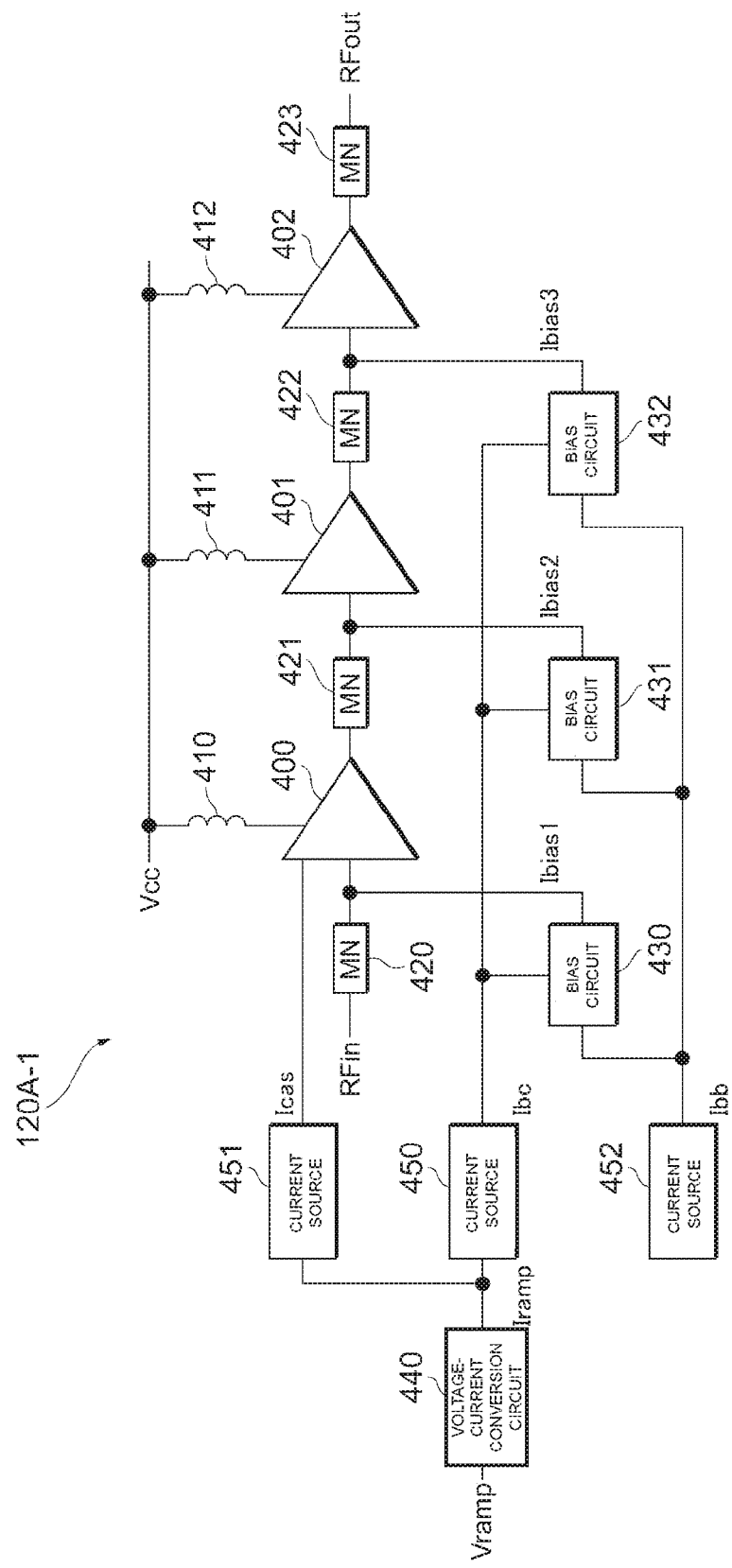
FIG. 4 is a diagram illustrating the configuration of a power amplifier module that is an example of the power amplifier module illustrated in FIG. 1.

FIG. 4 is a diagram illustrating the configuration of a power amplifier module 120A-1. The power amplifier module 120A-1 is an example of the power amplifier module 120. The power amplifier module 120A-1 includes amplifiers 400, 401, and 402, inductors 410, 411, and 412, matching networks (MNs) 420, 421, 422, and 423, bias circuits 430, 431, and 432, a voltage-current conversion circuit 440, and current sources 450, 451, and 452.

The amplifiers 400 to 402 constitute three-stage amplifiers. The amplifier 400 amplifies an input signal RFin and outputs an amplified signal (first amplified signal). The amplifier 401 amplifies the amplified signal (first amplified signal) output from the amplifier 400 and outputs an amplified signal (second amplified signal). The amplifier 402 amplifies the amplified signal (second amplified signal) output from the amplifier 401 and outputs an amplified signal. A constant power supply voltage Vcc is supplied to the amplifier 400. A bias current Ibias1 (first bias current) is also supplied to the amplifier 400 from the bias circuit 430. Likewise, the power supply voltage Vcc and a bias current Ibias2 (second bias current) are supplied to the amplifier 401. The power supply voltage Vcc and a bias current Ibias3 are supplied to the amplifier 402. The number of stages of amplifiers is not limited to three; the number of stages of amplifiers may be two or less or may be four or more.

Figure 5:
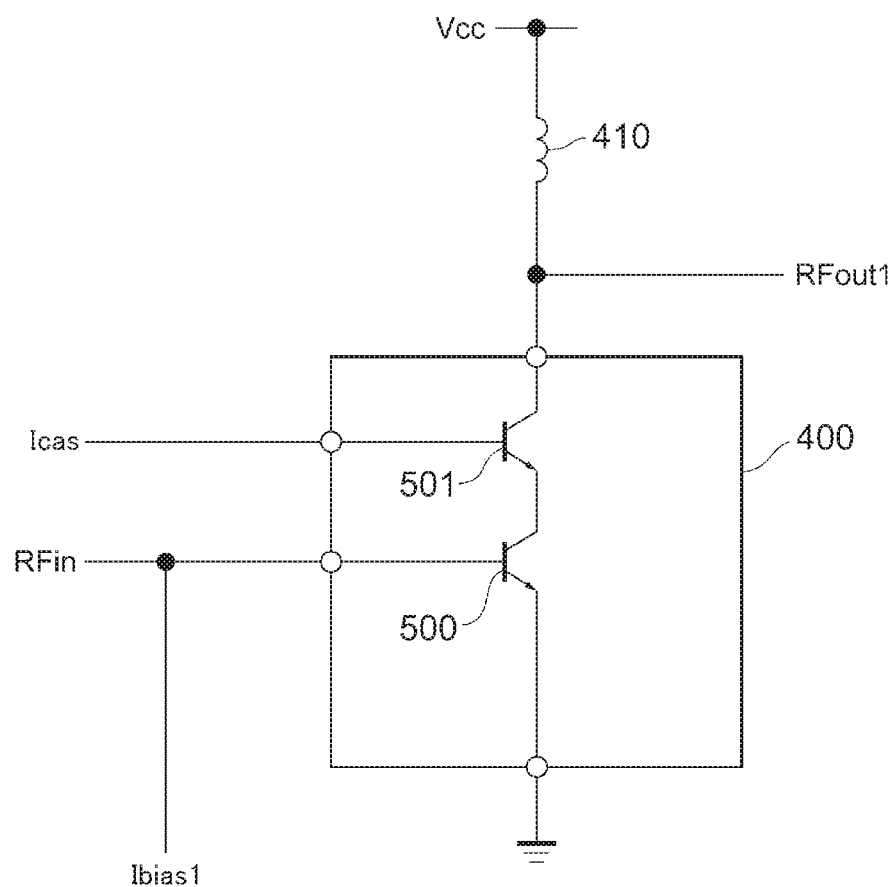
FIG. 5 is a diagram illustrating an example configuration of an amplifier.

FIG. 5 is a diagram illustrating an example configuration of the amplifier 400. As illustrated in FIG. 5, the amplifier 400 in the initial stage includes a transistor 500 (first transistor) and a transistor 501 (second transistor), and the transistor 501 is connected in cascode with the transistor 500. The transistors 500 and 501 are each a transistor such as a heterojunction bipolar transistor (HBT). Specifically, the lower-stage transistor 500 has a collector connected to an emitter of the transistor 501, a base to which the input signal RFin is supplied, and an emitter grounded. The upper-stage transistor 501 has a collector to which the power supply voltage Vcc is supplied via the inductor 410, a base to which a current Icas corresponding to the voltage Vramp is supplied, and an emitter connected to the collector of the transistor 500. Thus, the amount of current flowing through the lower-stage transistor 500 is limited by the amount of current flowing through the upper-stage transistor 501. Further, the collector voltage of the lower-stage transistor 500 is limited by the emitter voltage of the upper-stage transistor 501. The bias current Ibias1, which corresponds to the voltage Vramp, is supplied to the base of the transistor 500. Thus, an amplified signal RFout1 (first amplified signal) corresponding to the amount of the bias current Ibias1 is output from the collector of the transistor 501. The transistors 500 and 501 can have the same size, for example.

As illustrated in FIG. 5, in the amplifier 400, the gain is controlled by the bias current Ibias1. The gain may be controlled by a bias voltage instead of a bias current; however, a configuration in which the gain is controlled by a bias current has higher controllability. This will now be described. It is assumed that the collector current is represented by Ic, the base voltage by Vb, the base current by Ib, the current amplification factor by hFE, the saturation current by Is, the Boltzmann coefficient by k, the absolute temperature by T, the elemental charge of an electron by q, and the thermal voltage by $Vt=k \times T/q$. In the case of control using the base voltage, $\Delta Ic \approx Is \times \exp(\Delta Vb/Vt)$ holds. Accordingly, the collector current Ic rapidly increases when the base voltage Vb exceeds a threshold voltage. This results in low controllability. In the case of control using the base current, in contrast, $\Delta Ic = \Delta Ib \times hFE$ holds. Accordingly, the collector current Ic changes with respect to the base current Ib at a constant rate. This results in high controllability.

In this embodiment, the amplifiers 401 and 402 in the second and subsequent stages have a configuration in which, compared with the configuration illustrated in FIG. 5 (hereinafter referred to also as a "cascode-connection configuration"), the cascode-connected transistor 501 is not included (this configuration is hereinafter referred to also as a "single-transistor configuration"). Instead of the amplifier 400 in the initial stage, the amplifier 401 or 402 in any other stage may have a cascode-connection configuration, or a plurality of or all of the amplifiers 400, 401, and 402 may have a cascode-connection configuration. The amplifier 400 in the initial stage provides less output power of a signal than the amplifiers 401 and 402 in the second and three stages. Thus, when only the amplifier 400 in the initial stage has a cascode-connection configuration, signal attenuation caused by the cascode-connection configuration is prevented or reduced, compared with when any other amplifier has a cascode-connection configuration. The effect of the cascode-connection configuration will be described below.

Referring back to FIG. 4, the inductors 410 to 412 are each a choke inductor for preventing or reducing leakage of an RF signal to a power supply circuit.

The matching network 420 is disposed before the amplifier 400, the matching networks 421 and 422 are respectively disposed before and after the amplifiers 401 and 402, and the matching network 423 is disposed after the amplifier 402. The matching networks 420 to 423 are circuits for matching impedances between the preceding and subsequent circuits. The matching networks 420 to 423 are formed using capacitors and inductors, for example.

The bias circuits 430 to 432 supply the bias currents Ibias1 to Ibias3 to the amplifiers 400 to 402, respectively. The bias currents Ibias1 to Ibias3 are adjusted on the basis of a current Ibb output from the current source 452 and a current Ibc output from the current source 450.

Figure 6:
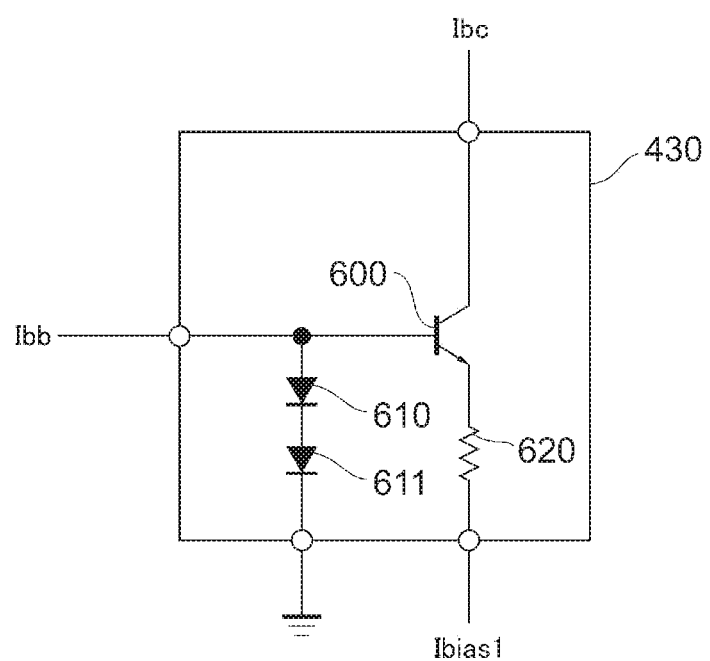
FIG. 6 is a diagram illustrating an example configuration of a bias circuit.

FIG. 6 is a diagram illustrating an example configuration of the bias circuit 430. The bias circuit 430 includes a transistor 600, diodes 610 and 611, and a resistor 620. The transistor 600 (third transistor) is, for example, an HBT. The diodes 610 and 611 are connected in series. The anode of the diode 610 is connected to a base of the transistor 600, and the cathode of the diode 611 is grounded. The resistor 620 has an end connected to an emitter of the transistor 600, and another end connected to the base of the transistor 500 included in the amplifier 400. The predetermined current Ibb (bias control current) is supplied to the base of the transistor 600. The current Ibc, which corresponds to the voltage Vramp, is supplied to the collector of the transistor 600. Accordingly, the bias current Ibias1, which corresponds to the voltage Vramp, is output from the emitter of the transistor 600 via the resistor 620. The configurations of the bias circuits 431 and 432 are similar to the configuration of the bias circuit 430 and are not described in detail herein. Instead of the diodes 610 and 611, transistors (diode-connected transistors), each having a collector and a base connected to each other, may be used.

Referring back to FIG. 4, the voltage-current conversion circuit 440 converts the voltage Vramp into a current Iramp and outputs the current Iramp. The current source 450 (first current source) outputs the current Ibc (first current) on the basis of the current Iramp. The current Ibc is supplied to the bias circuits 430 to 432. The current source 451 (second current source) outputs the current Icas (second current) on the basis of the current Iramp. The current Icas is supplied to only the amplifier 400 in the initial stage. The current source 452 outputs the current Ibb. The current Ibb remains constant during the slope control of the transmission signal.

Figure 7:
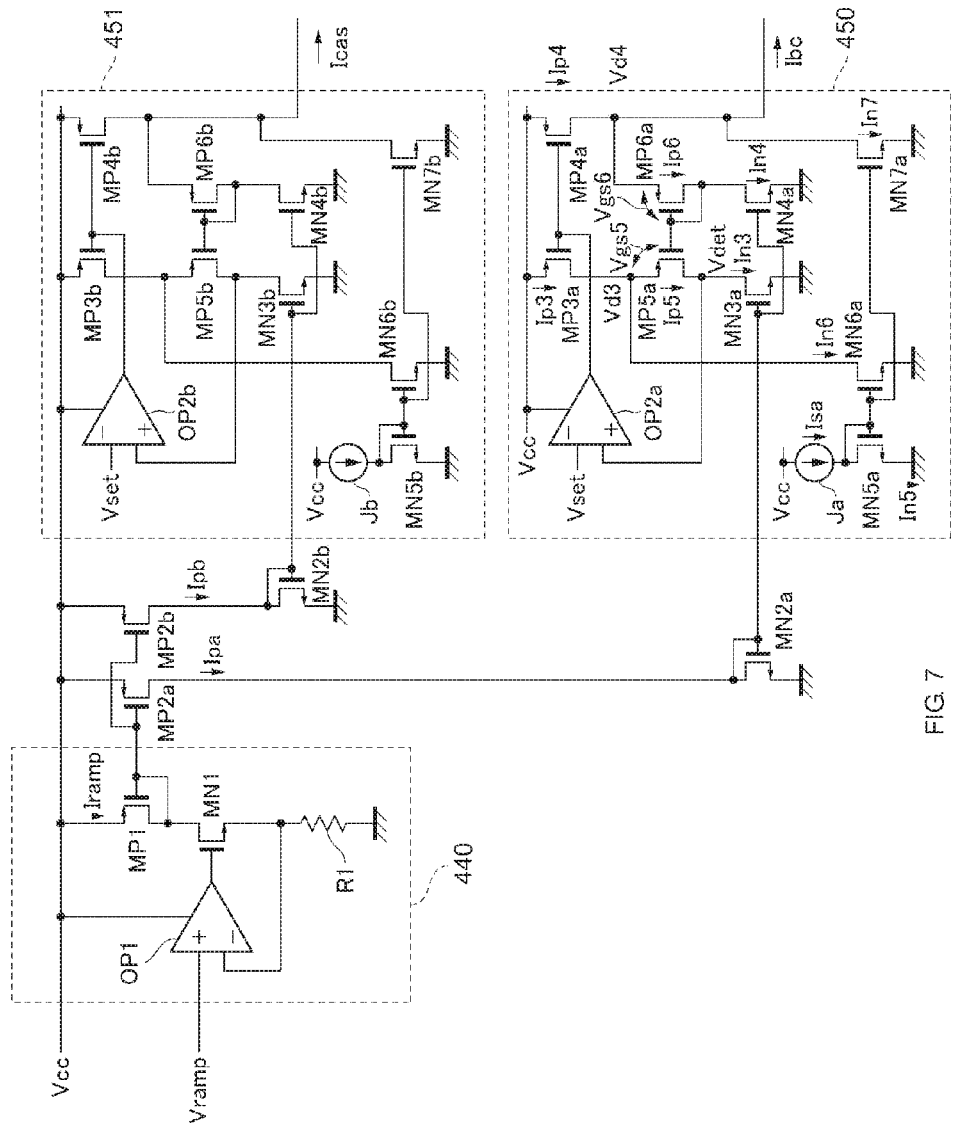
FIG. 7 is a diagram illustrating an example configuration of a voltage-current conversion circuit and current sources.

FIG. 7 is a diagram illustrating an example configuration of the voltage-current conversion circuit 440 and the current sources 450 and 451.

The voltage-current conversion circuit 440 includes an operational amplifier OP1, a p-channel MOSFET (MP1), an n-channel MOSFET (MN1), and a resistor R1.

The operational amplifier OP1 has a non-inverting input terminal to which the voltage Vramp is supplied, an inverting input terminal connected to a source of the n-channel MOSFET (MN1), and an output terminal connected to a gate of the n-channel MOSFET (MN1). The p-channel MOSFET (MP1) has a source to which the power supply voltage Vcc is supplied, a gate connected to a drain thereof, and the drain connected to the drain of the n-channel MOSFET (MN1). The source of the n-channel MOSFET (MN1) is connected to one end of the resistor R1. The other end of the resistor R1 is grounded.

An imaginary short established between the non-inverting input terminal and inverting input terminal of the operational amplifier OP1 allows the voltage at the one end of the resistor R1 to be equal to Vramp. If the resistor R1 has a resistance value r1, the current flowing through the p-channel MOSFET (MP1) and the n-channel MOSFET (MN1) is given by Vramp/r1. Accordingly, the current Iramp that flows through the p-channel MOSFET (MP1) has a value corresponding to the voltage Vramp.

P-channel MOSFETs (MP2*a* and MP2*b*) have sources to which the power supply voltage Vcc is supplied, gates connected to the gate of the p-channel MOSFET (MP1), and drains connected to drains of n-channel MOSFETs (MN2*a* and MN2*b*). The n-channel MOSFETs (MN2*a* and MN2*b*) have drains connected to the drains of the p-channel MOSFETs (MP2*a* and MP2*b*), gates connected to the drains thereof, and sources grounded. The p-channel MOSFETs (MP2*a* and MP2*b*) are each connected to the p-channel MOSFET (MP1) to form a current mirror. Thus, a current Ipa that flows through the p-channel MOSFET (MP2*a*) and the n-channel MOSFET (MN2*a*) and a current Ipb that flows through the p-channel MOSFET (MP2*b*) and the n-channel MOSFET (MN2*b*) have values corresponding to the current Iramp (that is, values corresponding to the voltage Vramp).

The current source 450 includes an operational amplifier OP2*a*, p-channel MOSFETs (MP3*a*, MP4*a*, MP5*a*, and MP6*a*), n-channel MOSFETs (MN3*a*, MN4*a*, MN5*a*, MN6*a*, and MN7*a*), and a current source Ja. The current source 451 includes an operational amplifier OP2*b*, p-channel MOSFETs (MP3*b*, MP4*b*, MP5*b*, and MP6*b*), n-channel MOSFETs (MN3*b*, MN4*b*, MN5*b*, MN6*b*, and MN7*b*), and a current source Jb. The following description will be given taking the current source 450 as an example. The configuration of the current source 451 is similar to the configuration of the current source 450 and is not described in detail herein.

The n-channel MOSFETs (MN3*a* and MN4*a*) have drains connected to drains of the p-channel MOSFETs (MP5*a* and MP6*a*), gates connected to the gate of the n-channel MOSFET (MN2*a*), and sources grounded. That is, the n-channel MOSFETs (MN3*a* and MN4*a*) are each connected to the n-channel MOSFET (MN2*a*) to form a current mirror. Accordingly, currents In3 and In4 that flow through the n-channel MOSFETs (MN3*a* and MN4*a*) are each proportional to the current Ipa that flows through the n-channel MOSFET (MN2*a*) (In3∝Ipa and In4∝Ipa).

The p-channel MOSFETs (MP3*a* and MP4*a*) have sources to which the power supply voltage Vcc is supplied, gates connected to the output terminal of the operational amplifier OP2*a*, and drains connected to sources of the p-channel MOSFETs (MP5*a* and MP6*a*). A current that is the sum of the current In3 and a current In6 flowing through the n-channel MOSFET (MN6*a*) flows through the p-channel MOSFET (MP3*a*). Thus, a current Ip3 that flows through the p-channel MOSFET (MP3*a*) has a value corresponding to the current Ipa that flows through the n-channel MOSFET (MN2*a*) (Ip3≈{In3(∝Ipa)+In6}). Since the p-channel MOSFET (MP4*a*) is mirror-connected with the p-channel MOSFET (MP3*a*), a current Ip4 that flows through the p-channel MOSFET (MP4*a*) is proportional to the current Ip3 that flows through the p-channel MOSFET (MP3*a*) (Ip4∝Ip3). Accordingly, the current Ip4 that flows through the p-channel MOSFET (MP4*a*) has a value corresponding to the current Ipa that flows through the n-channel MOSFET (MN2*a*) (Ip4∝Ip3≈{In3(∝Ipa)+In6}). Hence, the current Ibc (i.e., the output current of the current source 450), which is obtained by subtracting a current Ip6 that flows through the p-channel MOSFET (MP6*a*) and a current In7 that flows through the n-channel MOSFET (MN7*a*) from the current Ip4, also has a value corresponding to the current Ipa (i.e., an amount of current corresponding to the voltage Vramp).

The operational amplifier OP2*a* has an inverting input terminal to which a reference voltage Vset is supplied, a non-inverting input terminal to which a voltage Vdet is supplied, and an output terminal connected to the gates of the p-channel MOSFETs (MP3*a* and MP4*a*). The operational amplifier OP2*a* controls the gate voltages of the p-channel MOSFETs (MP3*a* and MP4*a*) so that, as a result of an imaginary short between the non-inverting input terminal and the inverting input terminal, the voltage Vdet is equal to the reference voltage Vset.

The p-channel MOSFET (MP5*a*) has a source connected to the drain of the p-channel MOSFET (MP3*a*), a gate connected to a gate of the p-channel MOSFET (MP6a), and a drain connected to the drain of the n-channel MOSFET (MN3a). The p-channel MOSFET (MP6a) has a source connected to the drain of the p-channel MOSFET (MP4a), a gate connected to a drain thereof, and the drain connected to the drain of the n-channel MOSFET (MN4a). Accordingly, the p-channel MOSFET (MP5a) is connected to the p-channel MOSFET (MP6a) to form a current mirror. The p-channel MOSFET (MP5a) can have the same current density as the p-channel MOSFET (MP6a).

The p-channel MOSFETs (MP5a and MP6a) operate so that the drain voltages of the p-channel MOSFETs (MP3a and MP4a) have the same potential. Specifically, if the drain voltages of the p-channel MOSFETs (MP3a and MP4a) are represented by Vd3 and Vd4 and the gate-source voltages of the p-channel MOSFETs (MP5a and MP6a) are represented by Vgs5 and Vgs6, then, Vd3−Vgs5=Vd4−Vgs6 holds since the gates of the p-channel MOSFETs (MP5a and MP6a) are connected to each other. Here, when the p-channel MOSFETs (MP5a and MP6a) have an equal current density, the gate-source voltages Vgs5 and Vgs6 of the p-channel MOSFETs (MP5a and MP6a) are equal. Thus, Vd3=Vd4 holds. Therefore, the drain voltages Vd3 and Vd4 of the p-channel MOSFETs (MP3a and MP4a) can be maintained so as to have the same potential, and current can be stably output.

The n-channel MOSFET (MN5a) has a drain to which a reference current Isa is supplied from the current source Ja, a gate connected to the drain thereof, and a source grounded. The n-channel MOSFET (MN6a) has a drain connected to the drain of the p-channel MOSFET (MP3a), a gate connected to the gate of the n-channel MOSFET (MN5a), and a source grounded. The n-channel MOSFET (MN7a) has a drain connected to the drain of the p-channel MOSFET (MP4a), a gate connected to the gate of the n-channel MOSFET (MN5a), and a source grounded. That is, the n-channel MOSFETs (MN6a and MN7a) are each connected to the n-channel MOSFET (MN5a) to form a current mirror. Hence, the current In6 that flows through the n-channel MOSFET (MN6a) and the current In7 that flows through the n-channel MOSFET (MN7a) have values corresponding to the reference current Isa output from the current source Ja. Thus, the amounts of the currents In6 and In7 are adjusted in accordance with a change in the amount of the reference current Isa.

Even when the current In3 has a very small value (i.e., the voltage Vramp is very low), the n-channel MOSFET (MN6a) causes a constant amount of the current In6 to flow through the p-channel MOSFET (MP3a), thereby maintaining the effect of the imaginary short of the operational amplifier OP2a. This prevents or reduces deterioration of the frequency characteristics of the feedback of the operational amplifier OP2a or prevents or reduces the occurrence of oscillation of the operational amplifier OP2a. In addition, the amount of the current Ibc output from the current source 450 is given by subtracting the current Ip6 and the current In7 from the current Ip4 that flows through the p-channel MOSFET (MP4a). Accordingly, the amount of the current Ibc changes in accordance with a change in the amount of the reference current Isa, and thus the responsiveness of the current Ibc to the reference current Isa is improved.

As described above, the current source 450 generates the current Ibc, which has a target level corresponding to the current Iramp (i.e., corresponding to the voltage Vramp) and outputs the current Ibc. The target level of the current Ibc is a level necessary to achieve the current to be supplied to the collectors of the respective transistors in the bias circuits 430 to 432. Specifically, the current Ibc increases in accordance with an increase in the voltage Vramp and decreases in accordance with a reduction in the voltage Vramp. The configuration of the current source 451 is similar to that of the current source 450. Accordingly, the current sources 450 and 451 can output the currents Ibc and Icas, which change in accordance with the voltage Vramp. For example, the configuration, element sizes, etc. of the current source 451 may be made different from those of the current source 450 to generate a smaller amount of current Icas than the amount of the current Ibc.

Figure 8:
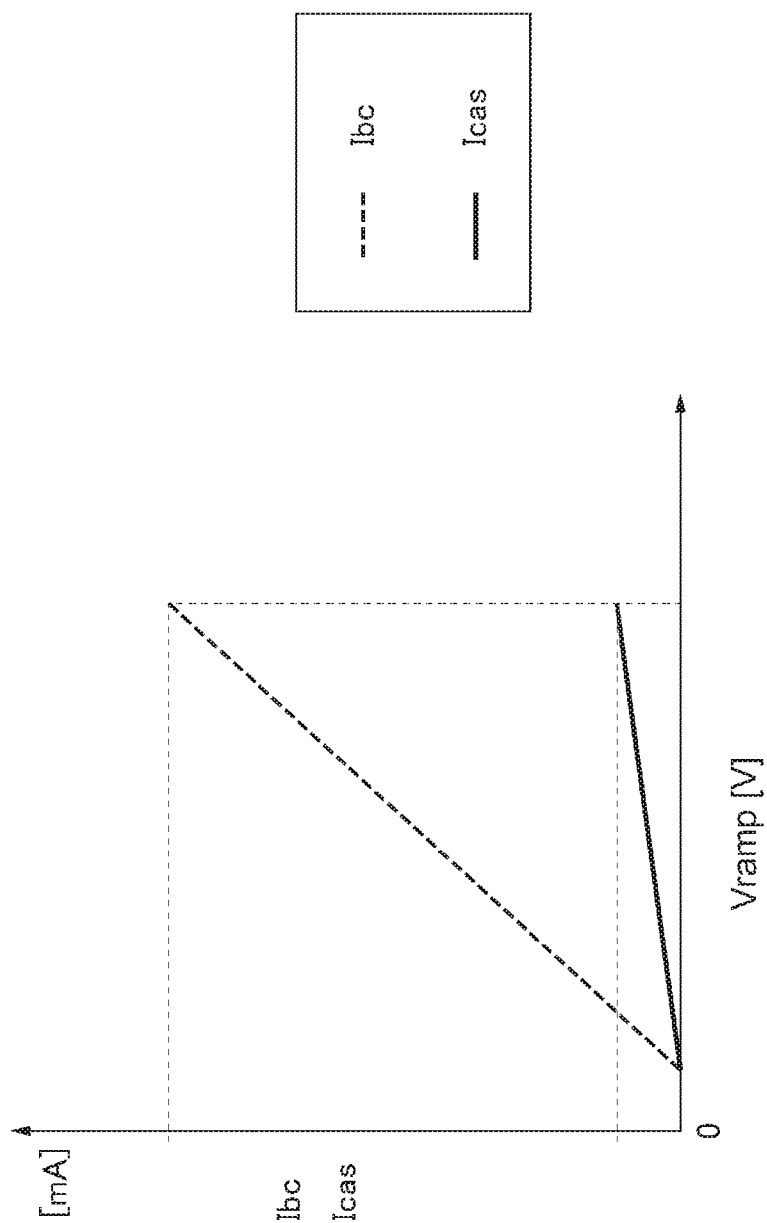
FIG. 8 is a graph illustrating an example relationship between the voltage (level control voltage) and currents.

FIG. 8 is a graph illustrating an example relationship between the voltage Vramp and the currents Ibc and Icas. As illustrated in FIG. 8, it is found that the current Ibc and the current Icas increase linearly as the voltage Vramp increases. Furthermore, the current Ibc changes by a larger amount with a change in the voltage Vramp than the current Icas. In this embodiment, therefore, the amount of the current Ibc is larger than the amount of the current Icas.

With the configuration described above, in the power amplifier module 120A-1, the gain of the amplifier 400 is controlled using both the currents Ibc and Icas, and the gains of the amplifiers 401 and 402 are controlled using the current Ibc. Specifically, since the current Ibc increases in accordance with an increase in the voltage Vramp, the bias currents Ibias1 to Ibias3 supplied from the bias circuits 430 to 432 increase. Accordingly, the gains of the amplifiers 400 to 402 increase in accordance with an increase in the voltage Vramp. In addition, since the current Icas increases in accordance with an increase in the voltage Vramp, the base current of the transistor 501 in the amplifier 400 in the initial stage increases. Accordingly, the gain of the amplifier 400 in the initial stage increases in accordance with an increase in the voltage Vramp. That is, in the power amplifier module 120, during a low-output-power period, the bias currents Ibias1 to Ibias3 are decreased to reduce the gains of the amplifiers 400 to 402, and during a high-output-power period, the bias currents Ibias1 to Ibias3 are increased to increase the gains of the amplifiers 400 to 402. The gains of the amplifiers 400 to 402 are controlled in the way described above, and thereby slope control of the transmission signal is performed. This configuration therefore enables slope control of a transmission signal while preventing or reducing an increase in circuit size, compared with the configuration in which an LDO regulator is used. Next, the operation of a cascode-connected transistor in the amplifier 400 in the initial stage will be described in detail.

Figure 9A:
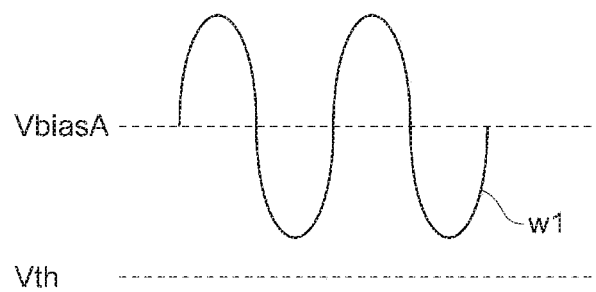
FIG. 9A is a schematic diagram of an ideal output waveform of an RF signal.
Figure 9B:
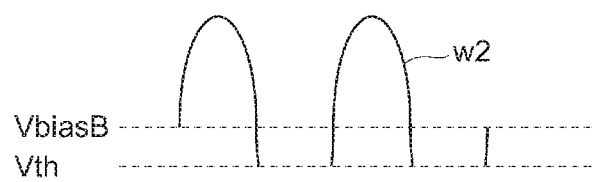
FIG. 9B is a schematic diagram of an output waveform of an RF signal in a comparative example.
Figure 9C:
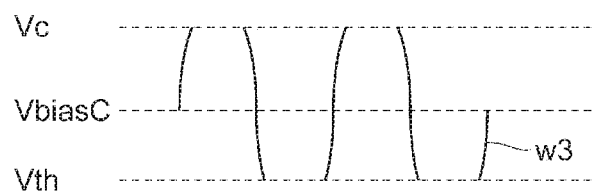
FIG. 9C is a schematic diagram of an output waveform of an RF signal in the amplifier.

FIG. 9A is a schematic diagram of an ideal output waveform of an RF signal, FIG. 9B is a schematic diagram of an output waveform of an RF signal in a comparative example, and FIG. 9C is a schematic diagram of an output waveform of an RF signal in the amplifier 400. In the comparative example, a configuration that does not include a cascode-connected transistor (single-transistor configuration) is used.

As illustrated in FIG. 9A, a transistor typically outputs a signal with a waveform w1 having no distortion when supplied with a bias voltage VbiasA so that the base-emitter voltage exceeds a threshold voltage Vth even when the voltage decreases in accordance with the waveform of an input signal. In the comparative example, however, the bias current is reduced in accordance with a reduction in the voltage Vramp during a low-output-power period. As a result, as illustrated in FIG. 9B, a bias voltage VbiasB excessively decreases, and no signal is output in an area where the base-emitter voltage is less than or equal to the threshold voltage Vth. Thus, a signal of a waveform w2 that is greatly distorted on one side (low-voltage side) is output.

In the comparative example, accordingly, distortion characteristics deteriorate, causing a problem in that the linearity of the gain is impaired.

In the amplifier 400, in contrast, during a low-output-power period, the amount of the current Icas also decreases in accordance with a decrease in the voltage Vramp. As a result, the amount of current flowing through the transistor 501 decreases. Since the amount of current flowing through the transistor 500 is limited by the amount of current flowing through the transistor 501, the amount of current flowing through the transistor 500 also decreases. Accordingly, the gain of the amplifier 400 can be reduced, compared with the comparative example, when the amount of bias current is the same as that in the comparative example. In other words, even if the amount of bias current is larger than that in the comparative example, the gain of the amplifier 400 can be reduced to substantially the same level as that of the comparative example. Thus, during a low-output-power period, deterioration of distortion characteristics caused by an excessive reduction in bias voltage can be prevented or reduced in an area where the voltage Vramp is low.

In this case, as illustrated in FIG. 9C, the signal output from the amplifier 400 has a waveform w3 in which, for example, no signal is output in both an area where the base-emitter voltage of the transistor 500 is less than or equal to the threshold voltage Vth and an area where the collector voltage of the transistor 500 is greater than or equal to an upper limit value Vc that is limited by the emitter voltage of the transistor 501. In the waveform w3, no signal is output on both the high- and low-voltage sides. Thus, an output waveform is exhibited which is more symmetrical with respect to a bias voltage VbiasC than the waveform w2 in which no signal is output only on the low-voltage side. Accordingly, the amplifier 400 has improved distortion characteristics, compared with the comparative example, resulting in improved linearity of the gain.

Figure 10:
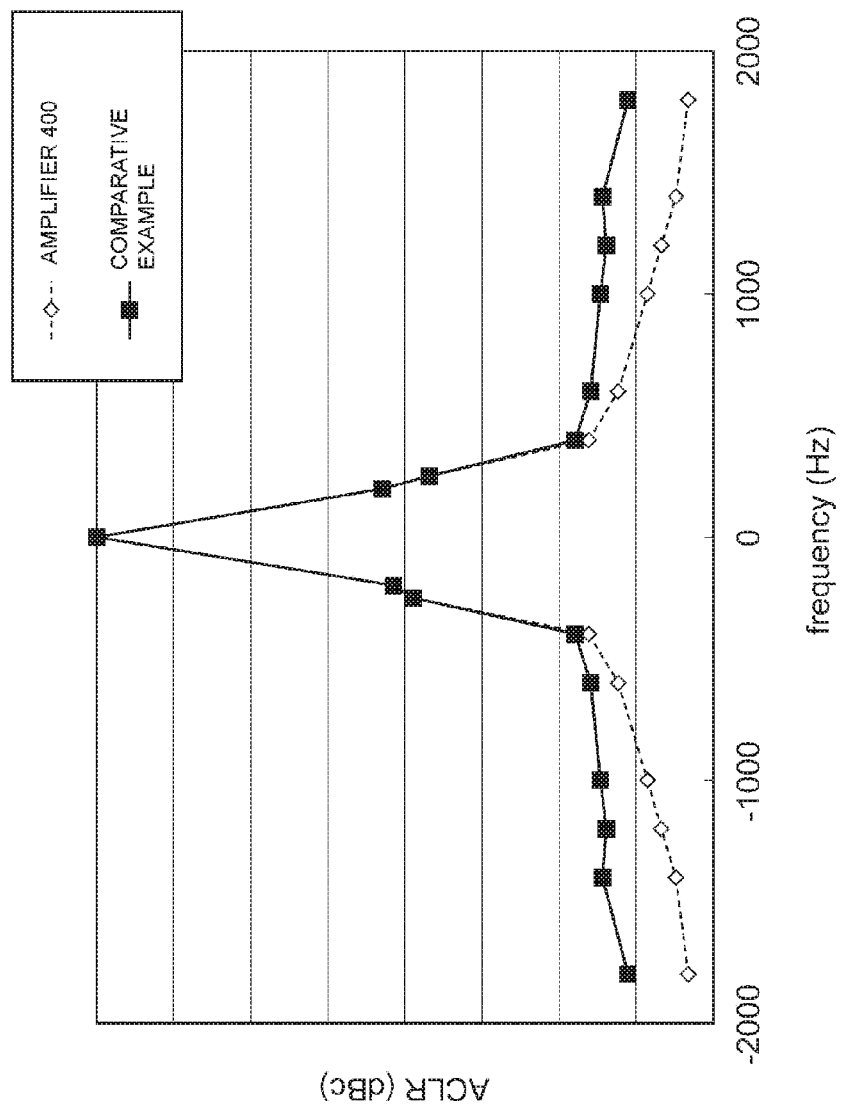
FIG. 10 is a graph illustrating results of simulation of adjacent channel leakage ratio (ACLR) characteristics in the amplifier and the comparative example.

FIG. 10 is a graph illustrating results of simulation of adjacent channel leakage ratio (ACLR) characteristics in the amplifier 400 and the comparative example. In the graph illustrated in FIG. 10, the vertical axis represents the ACLR in dBc, and the horizontal axis represents the frequency in Hz when the center frequency of the transmission signal is set to 0.

As illustrated in FIG. 10, it is found that in the amplifier 400, compared with the comparative example, the ACLR is reduced at frequencies other than the target frequency band of the transmission signal. It is therefore found that the amplifier 400 provided with a cascode-connection configuration has improved distortion characteristics, compared with the comparative example, and that, as a result, the linearity of the gain is improved.

Figure 11:
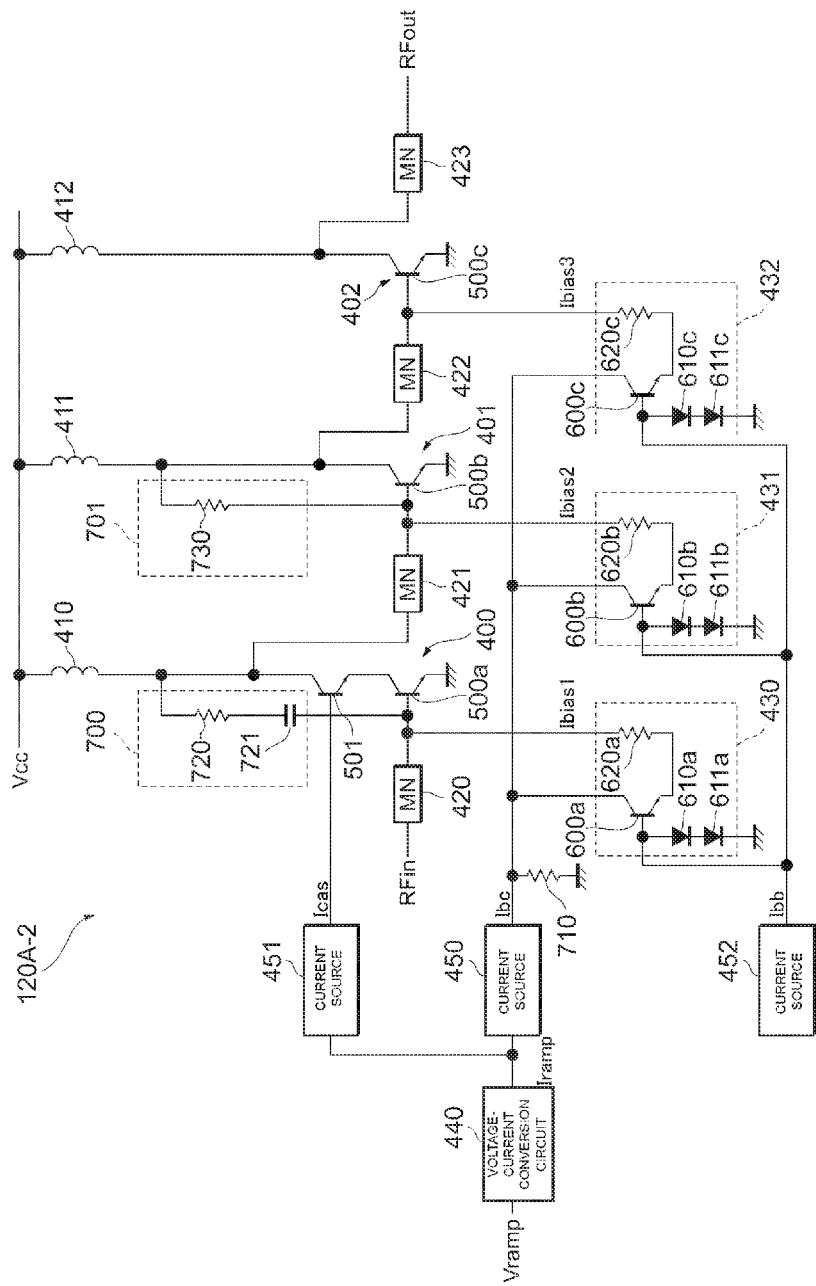
FIG. 11 is a diagram illustrating the configuration of a power amplifier module that is another example of the power amplifier module illustrated in FIG. 1.

FIG. 11 is a diagram illustrating the configuration of a power amplifier module 120A-2. The power amplifier module 120A-2 is an example of the power amplifier module 120. The same or substantially the same elements as those of the power amplifier module 120A-1 illustrated in FIG. 4 are assigned the same numerals and are not described herein. In FIG. 11, for convenience of illustration, elements included in the amplifiers 400 to 402 are represented by numerals that are similar to those in FIG. 5, and elements included in the bias circuits 430 to 432 are represented by numerals that are similar to those in FIG. 6.

The power amplifier module 120A-2 includes negative feedback circuits 700 and 701 and a resistor 710, in addition to the elements of the power amplifier module 120A-1.

The negative feedback circuit 700 includes a resistor 720 (first resistor) and a capacitor 721. The resistor 720 and the capacitor 721 are connected in series and are provided between the base of the transistor 500a and the collector of the transistor 501. The resistor 720 and the capacitor 721 stabilize the amplification operation of the amplifier 400 in the initial stage, which is constituted by the transistors 500a and 501. It is assumed here that the amplifier 400 in the initial stage has a typical configuration in which the configuration (single-transistor configuration) adopted in the comparative example includes the negative feedback circuit 700. When such a typical single-transistor configuration is modified into a cascode-connection configuration, the negative feedback circuit 700 disposed between the base of the transistor 500a and the collector of the transistor 501, rather than between the base and collector of the transistor 500a, can prevent or reduce a change in the output impedance of the amplifier in the initial stage. Accordingly, the typical single-transistor configuration described above can be easily modified in design.

The negative feedback circuit 701 includes a resistor 730. The resistor 730 is disposed between the base and collector of the transistor 500b (fourth transistor). The resistor 730 stabilizes the amplification operation of the amplifier 401 in the second stage, which is constituted by the transistor 500b. As described above, the negative feedback circuit may not include one of a resistor and a capacitor. The number of stages of amplifiers that include a negative feedback circuit is not limited to that in the illustrated example, and any one amplifier may include a negative feedback circuit or every amplifier may include a negative feedback circuit.

The resistor 710 (second resistor) has an end connected to the collectors of the transistors 600a (third transistor), 600b (fifth transistor), and 600c respectively included in the bias circuits 430 to 432, and another end grounded. The resistor 710 is, for example, a resistor having a comparatively small resistance value (e.g., about 250 to 700Ω). The use of the resistor 710 allows the current Ibb supplied from the current source 452 to the bias circuits 430 to 432 to flow through the resistor 710 via the bases and collectors of the transistors 600a, 600b, and 600c. This prevents or reduces the flow of the current Ibb into the amplifiers 400 to 402 via the bases and emitters of the transistors 600a, 600b, and 600c.

With the configuration described above, the power amplifier module 120A-2 can also achieve advantages similar to those of the power amplifier module 120A-1. Since the power amplifier module 120A-2 includes the negative feedback circuits 700 and 701, a stable amplification operation of amplifiers is achieved, compared with the power amplifier module 120A-1. In addition, since the power amplifier module 120A-2 includes the resistor 710, the flow of the current Ibb into the amplifiers 400 to 402 is prevented or reduced, compared with the power amplifier module 120A-1.

In this embodiment, the currents Ibc and Icas output from the current sources 450 and 451 change linearly with respect to the voltage Vramp. Alternatively, the current sources 450 and 451 may be configured to output a current Ibc and a current Icas that change non-linearly (e.g., with substantially the square) with respect to the voltage Vramp. In this case, for example, the rates of change of the currents Ibc and Icas when the voltage Vramp has a comparatively high level are higher than the rates of change of the currents Ibc and Icas when the voltage Vramp has a comparatively low level. Accordingly, the rates of change of the bias currents Ibias1 to Ibias3 to be supplied to the amplifiers 400 to 402 can be increased (the slopes can be made steeper) in an area where the voltage Vramp is high. Therefore, as illustrated in FIG. 2, slope control of the transmission signal can be performed so as not to change the signal level too gently at or near a falling edge (i.e., in an area with a high signal level).

The current sources 450 and 451 may be configured such that one of the current Ibc or the current Icas (e.g., the current Ibc) changes non-linearly with respect to the voltage Vramp and the other current (e.g., the current Icas) changes linearly with respect to the voltage Vramp.

The current source 450 may be a voltage source (first voltage source) that outputs a voltage (first voltage) corresponding to the voltage Vramp, instead of a current source. Likewise, the current source 451 may be a voltage source (second voltage source) that outputs a voltage (second voltage) corresponding to the voltage Vramp, instead of a current source. The first voltage may have a higher voltage value than the second voltage. The current source 452 may use a voltage source, instead of a current source, to supply a voltage (bias control voltage) to the bases of transistors in bias circuits.

An illustrative embodiment of the present disclosure has been described. In the power amplifier modules 120A-1 and 120A-2, the current Ibc output from the current source 450 is supplied to the collectors of transistors in the bias circuits 430 to 432. The current Ibc is controlled in accordance with the voltage Vramp, and thereby slope control of a transmission signal is performed. Thus, the power amplifier modules 120A-1 and 120A-2 can perform slope control of a transmission signal without necessarily using an LDO regulator. Accordingly, it may be possible to prevent or reduce an increase in circuit size, compared with the case where an LDO regulator is used. The amplifier 400 includes the transistor 501, which is connected in cascode with the transistor 500. The current Icas, which is controlled in accordance with the voltage Vramp, is supplied to the base of the transistor 501. Accordingly, it may be possible to reduce the gain of the amplifier 400, compared with a typical single-transistor configuration, even when a large amount of bias current is supplied during a low-output-power period. Thus, deterioration of distortion characteristics caused by an excessive reduction in bias voltage can be prevented or reduced in an area where the voltage Vramp is low.

The relationship between the current Ibc and the current Icas is not limited to any particular one. For example, the amount of the current Ibc may be larger than the amount of the current Icas.

The power amplifier modules 120A-1 and 120A-2 include a plurality of amplifiers 400 to 402, and the transistors in the amplifier 400 in the initial stage are connected in cascode. The amplifier 400 in the initial stage provides less output power of a signal than the amplifiers 401 and 402 in the subsequent stages. Thus, the amplifier 400 in the initial stage, which is provided with a cascode-connection configuration, prevents or reduces signal attenuation caused by the cascode-connection configuration.

The power amplifier module 120 may also be configured such that a voltage output from a voltage source is supplied to the collectors of the transistors in the bias circuits 430 to 432 and a voltage output from a voltage source is supplied to the base of the transistor 501, which is connected in cascode with the transistor 500 in the amplifier 400. This configuration allows the power amplifier module 120 to perform slope control of a transmission signal while preventing or reducing an increase in circuit size. In addition, since the transistors in the amplifier 400 are connected in cascode, the distortion characteristics of an amplifier can be improved, compared with a configuration having no cascode connection.

The relationship between a voltage (first voltage) supplied to a transistor included in a bias circuit and a voltage (second voltage) supplied to a transistor included in an amplifier is not limited to any particular one. For example, the first voltage may have a higher voltage value than the second voltage.

The power amplifier module 120A-2 includes the negative feedback circuit 700 between the collector of the transistor 501 and the base of the transistor 500a, and the negative feedback circuit 701 between the collector and base of the transistor 500b. Thus, the amplification operation of the amplifier 400 and the amplifier 401 is stabilized.

The configuration of the negative feedback circuit 700 is not limited to any particular one. For example, the negative feedback circuit 700 may include the resistor 720 and the capacitor 721, which are connected in series.

The power amplifier module 120A-2 further includes the resistor 710 between ground and collectors of the transistor 600a to 600c respectively included in the bias circuits 430 to 432. This configuration allows the current Ibb supplied from the current source 452 to the bias circuits 430 to 432 to flow through the resistor 710 via the bases and collectors of the transistors 600a, 600b, and 600c. Accordingly, the flow of the current Ibb into the amplifiers 400 to 402 via the emitters of the transistors 600a, 600b, and 600c is prevented or reduced.

The embodiment described above is intended for easy understanding of the present invention, and it is not intended to construe the present invention in a limiting fashion. Various modifications or improvements can be made to the present invention without departing from the gist of the present invention, and equivalents thereof are also included in the present invention. That is, the embodiment may be appropriately modified in design by those skilled in the art, and such modifications also fall within the scope of the present invention so long as the modifications include the features of the present invention. For example, the elements included in the embodiment and the arrangement, materials, conditions, shapes, sizes, and the like thereof are not limited to those described in the illustrated examples but can be modified as appropriate. In addition, the elements included in the embodiment can be combined as much as technically possible, and such combinations of elements also fall within the scope of the present invention so long as the combinations of elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
a first current source that outputs a first current corresponding to a level control voltage for controlling a signal level of an amplified signal;
a second current source that outputs a second current corresponding to the level control voltage;
a first transistor, wherein an input signal and a first bias current are supplied to a base of the first transistor and an emitter of the first transistor is grounded;
a second transistor, wherein an emitter of the second transistor is connected to a collector of the first transistor, the second current is supplied to a base of the second transistor, and a first amplified signal obtained by amplifying the input signal is output from a collector of the second transistor; and a third transistor, wherein the first current is supplied to a collector of the third transistor, a bias control current or voltage is supplied to a base of the third transistor, and the first bias current is supplied from an emitter of the third transistor to the base of the first transistor.

2. The power amplifier module according to claim 1, wherein the first current is greater than the second current.

3. The power amplifier module according to claim 1, further comprising:
a fourth transistor, wherein a power supply voltage is supplied to a collector of the fourth transistor, the first amplified signal and a second bias current are supplied to a base of the fourth transistor, an emitter of the fourth transistor is grounded, and a second amplified signal obtained by amplifying the first amplified signal is output from the collector of the fourth transistor; and
a fifth transistor, wherein the first current is supplied to a collector of the fifth transistor, the bias control current or voltage is supplied to a base of the fifth collector, and the second bias current is supplied from an emitter of the fifth collector to the base of the fourth transistor.

4. The power amplifier module according to claim 2, further comprising:
a fourth transistor, wherein a power supply voltage is supplied to a collector of the fourth transistor, the first amplified signal and a second bias current are supplied to a base of the fourth transistor, an emitter of the fourth transistor is grounded, and a second amplified signal obtained by amplifying the first amplified signal is output from the collector of the fourth transistor; and
a fifth transistor, wherein the first current is supplied to a collector of the fifth transistor, the bias control current or voltage is supplied to a base of the fifth collector, and the second bias current is supplied from an emitter of the fifth collector to the base of the fourth transistor.

5. A power amplifier module comprising:
a first voltage source that outputs a first voltage corresponding to a level control voltage for controlling a signal level of an amplified signal;
a second voltage source that outputs a second voltage corresponding to the level control voltage;
a first transistor, wherein an input signal and a first bias current are supplied to a base of the first transistor and an emitter of the first transistor is grounded;
a second transistor, wherein an emitter of the second transistor is connected to the collector of the first transistor, the second voltage is supplied to a base of the second transistor, and a first amplified signal obtained by amplifying the input signal is output from a collector of the second transistor; and
a third transistor, wherein the first voltage is supplied to a collector of the third transistor, a bias control current or voltage is supplied to a base of the third transistor, and the first bias current is supplied from an emitter of the third transistor to the base of the first transistor.

6. The power amplifier module according to claim 5, wherein the first voltage is greater than the second voltage.

7. The power amplifier module according to claim 5 further comprising:
a fourth transistor, wherein a power supply voltage is supplied to a collector of the fourth transistor, the first amplified signal and a second bias current are supplied to a base of the fourth transistor, an emitter of the fourth transistor is grounded, and a second amplified signal obtained by amplifying the first amplified signal is output from the collector of the fourth transistor; and
a fifth transistor, wherein the first voltage is supplied to a collector of the fifth transistor, the bias control current or voltage is supplied to a base of the fifth transistor, and the second bias current is supplied from an emitter of the fifth transistor to the base of the fourth transistor.

8. The power amplifier module according to claim 6 further comprising:
a fourth transistor, wherein a power supply voltage is supplied to a collector of the fourth transistor, the first amplified signal and a second bias current are supplied to a base of the fourth transistor, an emitter of the fourth transistor is grounded, and a second amplified signal obtained by amplifying the first amplified signal is output from the collector of the fourth transistor; and
a fifth transistor, wherein the first voltage is supplied to a collector of the fifth transistor, the bias control current or voltage is supplied to a base of the fifth transistor, and the second bias current is supplied from an emitter of the fifth transistor to the base of the fourth transistor.

9. The power amplifier module according to claim 1, further comprising a negative feedback circuit disposed between the collector of the second transistor and the base of the first transistor.

10. The power amplifier module according to claim 2, further comprising a negative feedback circuit disposed between the collector of the second transistor and the base of the first transistor.

11. The power amplifier module according to claim 3, further comprising a negative feedback circuit disposed between the collector of the second transistor and the base of the first transistor.

12. The power amplifier module according to claim 4, further comprising a negative feedback circuit disposed between the collector of the second transistor and the base of the first transistor.

13. The power amplifier module according to claim 5, further comprising a negative feedback circuit disposed between the collector of the second transistor and the base of the first transistor.

14. The power amplifier module according to claim 9, wherein the negative feedback circuit comprises a first resistor and a capacitor, the first resistor and the capacitor being connected in series.

15. The power amplifier module according to claim 10, wherein the negative feedback circuit comprises a first resistor and a capacitor, the first resistor and the capacitor being connected in series.

16. The power amplifier module according to claim 11, wherein the negative feedback circuit comprises a first resistor and a capacitor, the first resistor and the capacitor being connected in series.

17. The power amplifier module according to claim 12, wherein the negative feedback circuit comprises a first resistor and a capacitor, the first resistor and the capacitor being connected in series.

18. The power amplifier module according to claim 13, wherein the negative feedback circuit comprises a first resistor and a capacitor, the first resistor and the capacitor being connected in series.

19. The power amplifier module according to claim 1, further comprising a second resistor connected between the collector of the third transistor and ground.

20. The power amplifier module according to claim 2, further comprising a second resistor connected between the collector of the third transistor and ground.

21. The power amplifier module according to claim 3, further comprising a second resistor connected between the collector of the third transistor and ground.

22. The power amplifier module according to claim 4, further comprising a second resistor connected between the collector of the third transistor and ground.

23. The power amplifier module according to claim 5, further comprising a second resistor connected between the collector of the third transistor and ground.

* * * * *